United States Patent
Longere

(10) Patent No.: US 6,295,488 B1
(45) Date of Patent: *Sep. 25, 2001

(54) METHOD AND DEVICE FOR LOCATING FAULTS AND MALFUNCTIONS IN A COMPLEX SYSTEM

(75) Inventor: Jean-Yves Longere, Gardanne (FR)

(73) Assignee: Eurocopter, Cedex (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/099,187

(22) Filed: Jun. 18, 1998

(30) Foreign Application Priority Data

Jun. 23, 1997 (FR) .................................. 97 07768

(51) Int. Cl.[7] .................................................. G06F 17/40
(52) U.S. Cl. ............................ 701/29; 701/31; 701/34; 701/35
(58) Field of Search ................................ 701/35, 31, 34, 701/33, 29, 115

(56) References Cited

U.S. PATENT DOCUMENTS

| 4,409,670 | 10/1983 | Herndon et al. ............... 701/14 |
| 4,644,494 | * 2/1987 | Muller .......................... 364/900 |
| 4,646,241 | 2/1987 | Ratchford et al. ............. 701/14 |
| 4,729,102 | * 3/1988 | Miller, Jr. et al. ............. 364/424 |
| 4,788,531 | * 11/1988 | Corwin et al. ................. 340/945 |
| 5,056,056 | * 10/1991 | Gustin .......................... 364/900 |
| 5,500,797 | 3/1996 | Noger .......................... 701/35 |
| 5,671,141 | * 9/1997 | Smith et al. .. |
| 5,890,079 | * 3/1999 | Levine .......................... 701/14 |
| 5,948,026 | * 9/1999 | Beemer, II et al. ........... 701/35 |
| 5,974,349 | * 10/1999 | Levine .......................... 701/29 |

FOREIGN PATENT DOCUMENTS

| 0 069 690 A | 1/1983 | (EP) .............................. 3/10 |
| 0 543 698 A | 5/1993 | (FR) . |

OTHER PUBLICATIONS

IEEE 1990 National Aerospace and Electronics Conference NAECON 1990, May 21–25, 1990, vol. 3, pp. 1354–1357.
French Search Report dated Feb. 17, 1998, 3 pages.

\* cited by examiner

*Primary Examiner*—Tan Nguyen
*Assistant Examiner*—Marthe Y. Marc-Coleman
(74) *Attorney, Agent, or Firm*—Marshall, Gerstein & Borun

(57) ABSTRACT

An apparatus and method of locating faults in a complex system for an aircraft which monitors operation of the system to detect a malfunction, transmits a malfunction signal when a malfunction is detected, continuously records information about the system in a first memory, clears the recorded information after a given storage period, stores at least some of the information stored in the first memory in a second memory together with information about changes to the values of at least some of the parameters during a particular period after transmission of the malfunction signal, and determines the location of each fault giving rise to a malfunction signal from the information stored in the second memory.

13 Claims, 1 Drawing Sheet

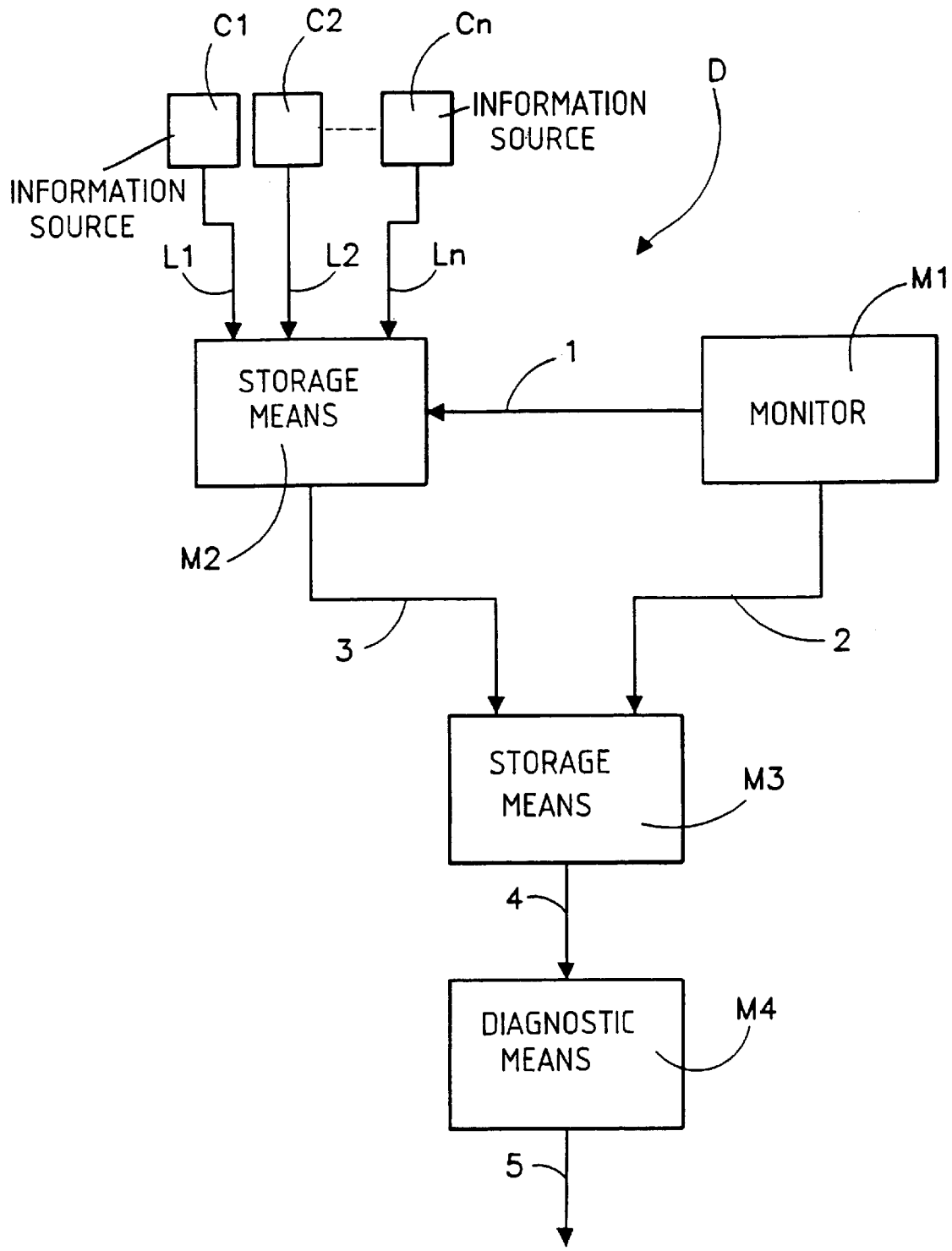

METHOD AND DEVICE FOR LOCATING FAULTS AND MALFUNCTIONS IN A COMPLEX SYSTEM

BACKGROUND OF THE INVENTION

The invention relates to a method for locating faults in a complex system and a device for implementing this method.

In the context of the present invention, a complex system is understood to be a system comprising a plurality of components, notably electronic components, and computers having many interconnections. Such complex systems exist in extremely varied fields of activity, for example in industry, in automobile engineering or in aviation.

In a complex system of this type, notably an aircraft, there are generally monitoring devices capable of determining the existence of a fault or a malfunction in said system, notably by checking the consistency of information transmitted by different components of said system, for example for safety reasons.

However, because of the many interconnections, defective operation of one component of said system has direct or indirect effects on other components of the system so that a single fault can be the source of a multitude of information transmitted by different components and each capable of being considered as transmitted by a defective component.

Thus, although it is generally possible to determine more or less easily the existence of a fault in such a complex system, it is often difficult or even impossible to locate such a fault.

This difficulty stems notably from the fact that it is impossible to store all the available information transmitted by the different components of the system, for example during an operating cycle of the system and capable of being used, for example by a maintenance operator, to locate a fault. In addition, even if such storage were technically feasible the mass of information stored would then be too great for a maintenance operator to be able to deduce any fault location from it.

SUMMARY OF THE INVENTION

The object of the present invention is to overcome these drawbacks. It concerns a method for locating effectively any type of fault in a complex system, irrespective of its complexity, and notably in an aircraft.

To this end said method according to the invention is remarkable in that:

A/ operation of said system is monitored and when a malfunction is detected a malfunction signal is transmitted;

B/ information about said system is continuously stored in a first memory, in particular the actual values of a plurality of parameters of said system, said recorded information being deleted after a particular storage period;

C/ each time a malfunction signal is transmitted, at least some of the information stored in said first memory is stored in a second memory together with information about changes to the values of at least some of said parameters during a particular period after transmission of said malfunction signal; and D/ the location of each fault giving rise to a malfunction signal is determined from the information stored in said second memory.

Thus by means of the invention:

it is possible to store all available information capable of being used to locate a fault since said first memory is continually cleared, releasing space and allowing continuous storage of all said information; and on the occurrence of a fault all the information enabling it to be located is collected, since the information generated during a particular period prior to the occurrence of the fault is stored in the second memory, together with changes to the parameters considered during a particular period after the occurrence of the fault, which overcomes the aforementioned drawbacks.

In addition, and advantageously:

a malfunction signal is transmitted by an operator on detecting a malfunction of the system; and/or monitoring of the system and transmission of the malfunction signals are effected automatically by at least one monitoring device of said system.

In addition, to facilitate the storage and/or to be able to use a first memory of reduced capacity and cost, in step B/:

the information is advantageously compressed before it is stored; and/or the information to be stored is selected according to its usefulness in helping location.

The storage period of step B/ and the period of step C/ are preferably each one minute.

Further, in step C/ the information to be stored in said second memory is advantageously selected from the information stored in said first memory, which reduces the amount of information to be stored.

In addition, in a particularly advantageous embodiment:

steps A/, B/ and C/ are performed while the system is operating and D/ is performed subsequently to said operation, in particular during maintenance when the system is stopped, for example at the end of a flight for an aircraft; and/or steps A/, B/ and C/ are performed on said system and step D/ is performed on a processing station external to said system.

In this latter case the information stored in the second memory is advantageously downloaded into a memory of said processing station by remote loading means, which enables a fault to be located while the system is operating (notably during the flight of an aircraft) and any parts to be changed to be prepared so as to be able to carry out maintenance quickly, for example during a stopover for a civil aircraft.

The information relating to a plurality of malfunction signals is preferably stored in said second memory, in particular during an operating cycle of the system, for example during a flight of an aircraft, and in step D/, to locate a fault relating to a particular malfunction signal, all the information about said particular malfunction signal and only this information is extracted from said second memory.

In a particularly advantageous embodiment, in step D/, to locate a fault, at least some of the information contained in said second memory is compared with the results of simulations.

In addition, according to the invention, in a step E/, the information in said second memory used to locate a fault is stored in a database together with information relating to said fault and its location. The information thus collected can in particular be used to develop automatic fault diagnostic software.

The invention also concerns a device for implementing the aforementioned method. According to the invention said device is remarkable in that it includes:

means for monitoring the system capable of transmitting a malfunction signal;

means for continuously storing information about said system in a first memory;

means for storing at least some of the information stored in said first memory in a second memory at the time of transmission of a malfunction signal; and means for locating a fault from the information stored in said second memory.

BRIEF DESCRIPTION OF THE DRAWING

How the invention can be put into effect will be clearly understood from the single figure of the accompanying drawing, which shows a block diagram of a device according to the invention.

DETAILED DESCRIPTION OF THE PREFERRED EMBODIMENTS

The device D according to the invention and represented schematically in the drawing is designed to locate faults in a complex system that is not represented, notably an aircraft, for example a helicopter.

To this end said device D according to the invention includes:

means M1 for monitoring the system, said means M1 being capable of transmitting a malfunction signal when a malfunction is detected in the system;

means M2 for continuously storing information about the system connected in a first memory to means M1 by a link 1;

means M3 for storing at least some information stored in said first memory in a second memory at the time of transmission of a malfunction signal by the means M1 connected to means M1 and M2 by respectively links 2 and 3. The information to be stored is preferably selected according to the nature of the malfunction; and means M4 for locating a fault from the information stored in said second memory connected to the means M3 by a link 4, the results obtained by said means M4 being transmitted to a user device that is not represented via a link 5.

The means M1 therefore monitor the system and transmit a malfunction signal when they detect a malfunction. According to the invention, malfunctions entailing transmission of such a signal can be:

either a problem identified by an operator of the system, for example a helicopter pilot, in which case transmission of the malfunction signal is generally activated manually;

or a malfunction detected automatically by a monitoring device of the system, for example:
an error detected by tests integrated into computers;
a functional malfunction detected by a data consolidation algorithm (for example a safety test);
an electrical drop out; and/or
an alarm or a set point triggered automatically.

According to the invention the monitoring devices associated with means M1 are continuously active throughout operation of the system. The same applies to means M2, which also operate continuously.

Means M2 continuously store information about said system in a first memory and in particular the actual values of a plurality of parameters of said system, said stored information being cleared after a particular storage period. To this end said first memory is a FIFO memory, in which deleting or output of a data item enables another data item to be stored or input.

To implement such storage means M2 are linked via a plurality of respective links L1 to Ln to information sources C1 to Cn, for example sensors or computers of the system.

Thus means M2 store at least some of the following data:
functional parameters, in particular information passing between components of the system;
environmental parameters, for example temperature, humidity, vibration, impact or external electrical and magnetic field;
system control parameters; and/or alarms or set points transmitted to an operator of the system.

Thus by virtue of the invention said first memory stores all the abovementioned information during the aforementioned storage period, which is preferably one minute.

However, when the amount of information to be stored is too great and/or when it is desirable to use a first memory of reduced capacity and therefore cost, different techniques are implemented to limit the volume of this information notably:

the information is compressed before being stored; and/or in addition to the functional and/or environmental parameters stored during the last minute, and which are continuously changing, only the last n control parameters and the last n alarms and set points addressed to the operator are stored, n being preferably equal to five; and if the abovementioned two measures are insufficient, the information to be stored is selected according to its usefulness in helping location.

Note that with the aforementioned objective it is also possible to alter the frequency of acquisition of the information to be stored.

In addition, and as previously indicated, each time a malfunction signal is transmitted by means M1, means M3 store at least some of the information stored in said first memory (and therefore representing the changes to parameters which precede the occurrence of the malfunction reported) in a second memory, together with information about changes to the values of at least some of said parameters during a particular period, preferably a minute, after transmission of said malfunction signal (and therefore representing changes to these parameters which follow the occurrence of the malfunction).

Similarly, at this stage of implementation of the invention, to reduce the amount of information to be stored it is possible to select the information to be stored in the second memory, notably according to the malfunction considered. This is merely optional, of course.

Information stored in said second memory is processed in a last stage so as to deduce from it the location of the fault(s) reported. This last stage is implemented:

either by means of an ordinary maintenance procedure carried out by a maintenance operator who is given the abovementioned stored information on an appropriate medium;

or using automatic diagnostic means M4.

Information about a plurality of malfunction signals is generally stored in the second memory, of course, and to locate a fault relating to a particular malfunction signal all of the information about said particular malfunction signal is extracted from said second memory.

According to the invention, in a simplified first embodiment, said information is presented to the maintenance operator in the chronological order in which it was stored, while in a more elaborate second embodiment the maintenance operator is offered means of searching for information using keywords, for example, relating to the malfunction giving rise to the malfunction signal considered.

In addition, to establish an automatic diagnosis or to facilitate manual diagnosis, means 4 can use information processing techniques which are common in the maintenance field, for example a decision logic diagram, an expert system or reasoning based on analogy from similar cases.

However, in a particularly advantageous embodiment of the invention, to locate a fault means M4 compare at least some information contained in said second memory with the results of simulations carried out on a behavioral model of the system programmed into said means M4.

Of course, in the context of the invention a fault can be located:

- either directly when the information relating to a malfunction signal is stored;
- or subsequently, notably when the system is no longer operating, for example during a stopover of a civil aircraft.

In this latter case the information stored on the is aircraft can be transmitted by remote loading means to a ground processing station during the flight to expedite fault diagnosis. From such a diagnosis, the ground maintenance operator can then:

- either prepare the equipment to be changed or anticipate a repair, if necessary;
- or reroute the aircraft to a site where the change and/or repair can be carried out more easily.

In one particular embodiment said means M4 or other means that are not represented store the information from said second memory used to locate a fault in a database together with information about said fault and its location. This database can in particular be used to develop or improve automatic fault diagnostic software to suit the system considered.

There is claimed:

1. A method of locating faults in a complex system for an aircraft, comprising:

monitoring operation of said system to detect a malfunction of one component of said system;

transmitting a malfunction signal when a malfunction of one component of said system is detected;

continuously recording information about said system in a first memory, said information including actual values of a plurality of parameters of said system;

clearing said recorded information after a given storage period;

each time a malfunction signal is transmitted, storing at least some of the information stored in said first memory in a second memory together with information about changes to the values of at least some of said parameters during a particular period after transmission of said malfunction signal; and determining the location of each malfunction giving rise to a malfunction signal from said information stored in said second memory, wherein all information about one of said malfunction signals is extracted from said second memory to locate a malfunction relating to one of the plurality of malfunction signals.

2. A method as claimed in claim 1 comprising transmitting a malfunction signal by an operator in response to detecting a malfunction of the system.

3. A method as claimed in claim 1 comprising monitoring said system and transmission of malfunction signals automatically by at least one monitoring device of said system.

4. The method claimed in claim 1 comprising compressing said information before it is stored in said first memory.

5. The method claimed in claim 1 comprising selecting said information to be stored according to its usefulness in helping to determine the location of each malfunction.

6. The method claimed in claim 1 wherein said given storage period comprises one minute.

7. The method claimed in claim 1 comprising selecting said information to be stored in said second memory from said information stored in said first memory.

8. The method claimed in claim 1 wherein said monitoring, transmitting, continuously recording, clearing, and storing actions are performed while said system is operating and wherein said determining action is performed subsequently to said operation.

9. The method claimed in claim 1 wherein said monitoring, transmitting, continuously recording, clearing, and storing actions are performed on said system and wherein said determining action is performed on a processing station external to said system.

10. The method claimed in claim 9 wherein said information stored in said second memory is downloaded into a memory of said processing station by remote loading means.

11. The method claimed in claim 1 wherein at least some of said information contained in said second memory is compared with the results of a simulation to locate a malfunction.

12. The method claimed in claim 1 comprising storing said information in said second memory used to locate a malfunction in a database together with information relating to said malfunction and its location.

13. A device for implementing the method claimed in claim 1 which comprises:

means (M1) for monitoring said system, capable of transmitting a malfunction signal;

means (M2) for continuously storing information about said system in a first memory;

means (M3) for storing at least some of the information stored in said first memory in a second memory at the time of transmission of a malfunction signal; and means (M4) for locating a malfunction from said information stored in said second memory.

* * * * *